United States Patent
Shimizu et al.

(10) Patent No.: US 8,547,265 B2
(45) Date of Patent: Oct. 1, 2013

(54) POWER SUPPLY APPARATUS FOR TEST APPARATUS

(75) Inventors: Takahiko Shimizu, Tokyo (JP); Katsuhiko Degawa, Tokyo (JP); Hironori Tanaka, Tokyo (JP)

(73) Assignee: Advantest Corporation, Tokyo (JP)

(*) Notice: Subject to any disclaimer, the term of this patent is extended or adjusted under 35 U.S.C. 154(b) by 85 days.

(21) Appl. No.: 13/160,309

(22) Filed: Jun. 14, 2011

(65) Prior Publication Data

US 2011/0309960 A1 Dec. 22, 2011

(30) Foreign Application Priority Data

Jun. 17, 2010 (JP) ................................. 2010-137923

(51) Int. Cl.
*H03M 1/00* (2006.01)

(52) U.S. Cl.
USPC ............................ 341/142; 341/144; 341/155

(58) Field of Classification Search
USPC ................... 341/110, 144, 155, 142; 307/82; 235/454
See application file for complete search history.

(56) References Cited

U.S. PATENT DOCUMENTS

| | | | | |
|---|---|---|---|---|
| 5,854,781 A | * | 12/1998 | Kurihara | 369/53.29 |
| 6,095,417 A | * | 8/2000 | Ahlquist et al. | 235/454 |
| 7,382,303 B1 | * | 6/2008 | Maloney et al. | 341/155 |
| 7,468,957 B2 | * | 12/2008 | Baba | 370/286 |
| 7,868,800 B2 | * | 1/2011 | Huang et al. | 341/142 |
| 2009/0179500 A1 | * | 7/2009 | Ragonese et al. | 307/82 |

* cited by examiner

*Primary Examiner* — Peguy Jean Pierre

(74) *Attorney, Agent, or Firm* — Ladas & Parry, LLP

(57) ABSTRACT

A power supply apparatus is provided for a test apparatus configured to supply a power supply signal to a DUT. An A/D converter performs analog/digital conversion of an analog observed value that corresponds to a power supply signal so as to generate a digital observed value. A digital signal processing circuit generates, by means of digital processing, a control value adjusted such that the digital observed value received from the A/D converter matches a predetermined reference value. A D/A converter performs digital/analog conversion of the control value, and supplies the resulting value to the DUT as the power supply signal. A digital signal processing circuit is configured to be capable of changing the content of its signal processing.

12 Claims, 9 Drawing Sheets

PRIOR ART

POWER SUPPLY APPARATUS FOR TEST APPARATUS

CROSS-REFERENCE TO RELATED APPLICATIONS

This application claims priority to Japanese Patent Application No. 2010-137923 filed on Jun. 17, 2010 the disclosure of which is incorporated herein by reference.

BACKGROUND OF THE INVENTION

1. Field of the Invention

The present invention relates to a power supply apparatus configured to supply a power supply voltage or a power supply current to a device under test.

2. Description of the Related Art

A test apparatus includes a power supply apparatus configured to supply a power supply voltage or a power supply current (which will be referred to as the "power supply voltage Vdd" hereafter) to a device under test (DUT). FIG. 1 is a block diagram which shows a schematic configuration of a conventional power supply apparatus. A power supply apparatus 1100 includes a power supply output unit 1026 and a frequency controller (which will be referred to as the "controller" hereafter) 1024 configured to control the power supply output unit 1026. For example, the power supply output unit 1026 is configured as an operational amplifier (buffer), a DC/DC converter, a linear regulator, or a constant current source, and is configured to generate a power supply voltage or a power supply current (output signal OUT) to be supplied to the DUT 1.

A decoupling capacitor C1 is arranged in the vicinity of the power supply terminal of the DUT 1. Furthermore, the output terminal of the power supply apparatus 1100 and the power supply terminal of the DUT 1 are connected via a cable. The target to be controlled by the power supply apparatus 1100 is not the output signal OUT of the power supply output unit 1026, but is the power supply voltage Vdd actually applied to the power supply terminal of the DUT 1. With conventional techniques, the controller 1024 outputs a control value such that the difference between the fed-back observed value (control target) and a predetermined reference value (standard value) becomes zero. Examples of such observed values include a feedback signal that corresponds to the power supply voltage or the power supply current supplied to the DUT 1. For example, a circuit component 1022 represented by a subtractor symbol in FIG. 1 is configured as an error amplifier (operational amplifier), and is configured to amplify the difference between the observed value and the reference value. The controller 1024 configured as an analog circuit generates a control value such that the difference becomes zero. The state of the power supply output unit 1026 is feedback-controlled according to the control value. As a result, the power supply voltage Vdd to be controlled is stabilized to the target value. The parameters to be taken into account in the control operation for a control target 1010 are collectively represented by a symbolic parameter, i.e., a parasitic parameter 1030. The parasitic parameter 1030 includes parasitic resistances, parasitic capacitances, parasitic inductances, and so on, of the power supply cable and internal components of the power supply apparatus 1100.

With conventional techniques, the controller 1024 is configured using an analog circuit. This leads to a problem in that the overall performance of the controller 1024 is fixedly determined by the analog elements that form the controller 1024. Furthermore, the control target 1010 is subject to the effects of fluctuation in the load current, and to the effects of the decoupling capacitor C1 arranged as a peripheral component. In addition, in a case in which the controller 1024 is designed giving consideration to the effects of the parasitic parameter 1030, it results in a complicated circuit configuration and an increased number of circuit components. Moreover, the control performance is fixed according to the circuit configuration. This leads to a problem in which such an arrangement cannot allow the control performance to be changed in a real time manner. A method can be conceived in which multiple circuits are prepared beforehand, and the circuit is switched as necessary. However, such an arrangement leads to an increased circuit area and increased costs, which is not realistic. Furthermore, in order to suppress the effects of temperature drift or the like that can occur in analog elements, there is a need to provide high-precision analog elements or a compensation circuit. This also leads to an increased circuit area and increased costs.

SUMMARY OF THE INVENTION

The present invention has been made in order to solve such problems. Accordingly, it is an exemplary purpose of the present invention to provide a power supply apparatus which is capable of stably supplying electric power to a device under test while suppressing increases in the circuit area and costs.

An embodiment of the present invention relates to a power supply apparatus for a test apparatus configured to supply a power supply signal to a device under test. The power supply apparatus comprises: an A/D converter configured to perform analog/digital conversion of an analog observed value that corresponds to the power supply signal so as to generate a digital observed value; a digital signal processing circuit configured to generate, by digital processing, a control value adjusted such that the digital observed value received from the A/D converter matches a predetermined reference value; a D/A converter configured to perform digital/analog conversion of the control value, and to supply the control value thus subjected to digital/analog conversion as the power supply signal. The digital signal processing circuit is configured to be capable of switching the content of signal processing.

With such an embodiment, by employing such a digital signal processing circuit, such an arrangement is capable of flexibly reconstructing the control characteristics according to the state of the device under test which acts as a load, thereby stably supplying electric power to the device under test. Furthermore, such an arrangement is capable of suppressing increases in the circuit area and costs.

Also, the digital signal processing circuit may be configured to switch the content of the signal processing according to a range in which the observed value is included.

Also, the digital signal processing circuit may be configured to have a first mode, a second mode, and a third mode, which are switchable, and in each of which the content of the signal processing is different, when the generation of the power supply signal is initiated. Also, when the power supply signal is lower than a first threshold value, the digital signal processing circuit may operate in the first mode. Also, when the power supply signal is higher than the first threshold value and is lower than a second threshold value that is set to be higher than the first threshold value, the digital signal processing circuit may operate in the second mode. Also, when the power supply signal is higher than the second threshold value, the digital signal processing circuit may operate in the third mode.

In the start-up operation of the power supply apparatus, by changing the signal processing content, i.e., by changing the control characteristics, according to the degree to which the power supply signal rises, such an arrangement is capable of controlling the power supply signal such that it approaches the reference value while suppressing overshoot and ringing in the power supply signal.

Also, the digital signal processing circuit may be configured to have a fourth mode and a fifth mode, which are switchable, and in each of which the content of the signal processing is different, when the power supply signal is to be stably generated. Also, when the power supply signal transits from a state in which it is higher than a third threshold value set to be lower than the reference value to a state in which it is lower than a fourth threshold value set to be lower than the third threshold value, the digital signal processing circuit may be switched to the fifth mode. Also, when the power supply signal transits from a state in which it is lower than the fourth threshold value to a state in which it is higher than the third threshold value, the digital signal processing circuit may be switched to the fourth mode.

Such an arrangement is capable of suppressing fluctuation in the power supply signal even if a sudden increase occurs in the current consumption of the device under test.

Also, the digital signal processing circuit may be configured to have a sixth mode and a seventh mode, which are switchable, and in each of which the content of the signal processing is different, when the power supply signal is to be stably generated. Also, when the power supply signal transits from a state in which it is lower than a fifth threshold value set to be higher than the reference value to a state in which it is higher than a sixth threshold value set to be higher than the fifth threshold value, the digital signal processing circuit may be switched to the seventh mode. Also, when the power supply signal transits from a state in which it is higher than the sixth threshold value to a state in which it is lower than the fifth threshold value, the digital signal processing circuit may be switched to the sixth mode.

Such an arrangement is capable of suppressing fluctuation in the power supply signal even if a sudden decrease occurs in the current consumption of the device under test.

Also, the digital signal processing circuit may be configured to have a fourth mode and a fifth mode, which are switchable, and in each of which the content of the signal processing is different, when the power supply signal is to be stably generated. Also, when a transition occurs from a state in which the absolute value of the difference between the power supply signal and the reference value is smaller than a first difference threshold value to a state in which it is greater than a second difference threshold value set to be greater than the first difference threshold value, the digital signal processing circuit may be switched to the fifth mode. Also, when a transition occurs from a state in which the absolute value of the difference is greater than the second difference threshold value to a state in which it is smaller than the first difference threshold value, the digital signal processing circuit may be switched to the fourth mode.

Such an arrangement is capable of suppressing fluctuation in the power supply signal even if a sudden increase or a sudden decrease occurs in the current consumption of the device under test.

Also, the change of the content of the signal processing may be a change of parameters used in digital signal processing.

Also, the change of the content of the signal processing may be a change of operation expressions used in digital signal processing.

Also, the digital signal processing circuit may be configured to change the content of the signal processing according to the value of the digital observed value.

Also, a power supply apparatus according to an embodiment may further comprise a comparator configured to compare the observed value with a predetermined threshold value. Also, the digital signal processing circuit may be configured to change the content of the signal processing according to an output signal of the comparator.

Also, the digital signal processing circuit may be configured to be capable of generating a threshold control signal subjected to pulse width modulation such that it has a duty ratio that corresponds to the threshold value. Also, the power supply apparatus may further comprise a low-pass filter configured to perform filtering of the threshold control signal so as to generate the threshold value.

Also, the digital signal processing circuit may be configured to be capable of generating a threshold control signal having a digital value that corresponds to the threshold value. Also, the power supply apparatus may further comprise a second D/A converter configured to perform digital/analog conversion of the threshold control signal so as to generate the threshold value.

Also, the threshold value may be switchable between multiple values according to the content of the signal processing.

Another embodiment of the present invention relates to a test apparatus. The test apparatus comprises a power supply apparatus according to any one of the aforementioned embodiments, configured to supply electric power to a device under test.

Such an embodiment is capable of judging the quality of, and of identifying defective parts of, the device under test, while suppressing the effects of the power supply.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 2:
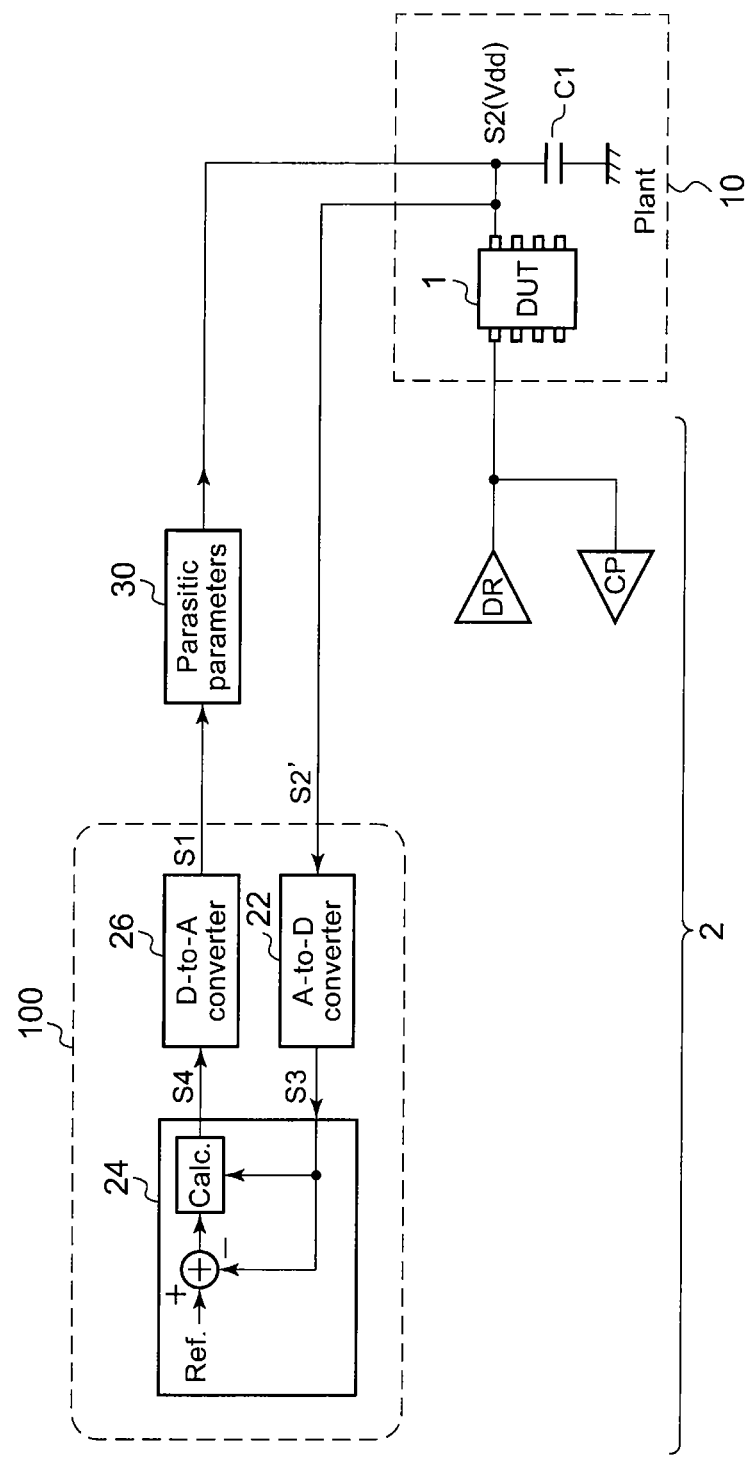
FIG. 2 is a block diagram which shows a test apparatus including a power supply apparatus according to an embodiment.

FIG. 2 is a block diagram which shows a test apparatus 2 including a power supply apparatus 100 according to an embodiment. The test apparatus 2 supplies a signal to a DUT 1, compares a signal received from the DUT 1 with an expected value, and judges the quality of, or determines defective parts of, the DUT 1.

The test apparatus 2 includes a driver DR, a comparator (timing comparator) CP, a power supply apparatus 100, and so forth. The driver DR outputs a test signal to the DUT 1. The test signal is generated by a timing generator TG, a pattern generator PG, a waveform shaper FC, and so forth, which are not shown. The test signal thus generated is input to the driver DR. The signal output from the DUT 1 is input to the comparator CP. The comparator CP compares the signal received from the DUT 1 with a predetermined threshold value, and latches the comparison result at an appropriate timing. The output signal of the comparator CP is compared with its expected value. The above is the schematic configuration of the test apparatus 2.

The power supply apparatus 100 generates a power supply voltage Vdd or a power supply current (which will also be referred to as the "power supply signal S1" hereafter) for the DUT 1, and supplies the power supply signal S1 thus generated to a power supply terminal of the DUT 1 via a power supply cable or the like. The power supply signal received at the power supply terminal of the DUT 1 is represented by S2, which is distinguished from S1.

Figure 1:
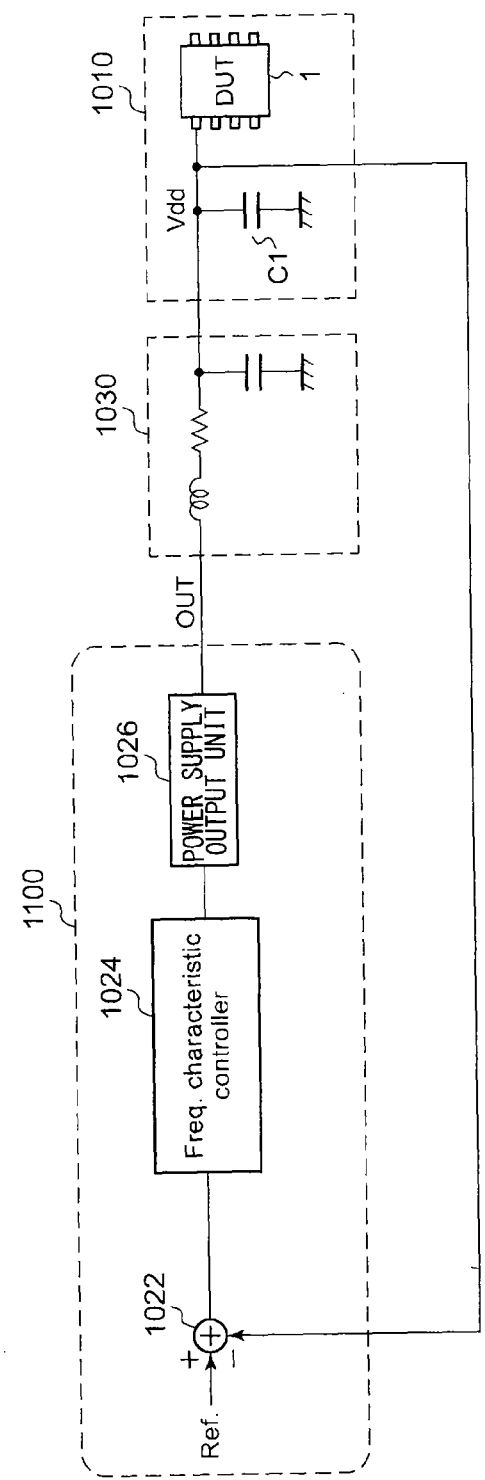
FIG. 1 is a block diagram which shows a schematic configuration of a conventional power supply apparatus.

A parasitic parameter 30 is a symbolic parameter which collectively represents the parameters to be taken into account in the control operation for the control target 10 in the same way as described with reference to FIG. 1. That is to say, the parasitic parameter 30 is not an explicit element that actually exits in the circuit.

The test apparatus 2 tests the DUT 1 while dynamically switching the state of the DUT 1. Accordingly, the current consumption of the DUT 1, i.e., the load of the power supply apparatus 100, changes dynamically. With the present embodiment, the power supply signal S1 functions as the power supply voltage Vdd.

A typical power supply apparatus has a problem in that, if the load changes suddenly, the feedback control operation for the power supply signal does not follow the sudden change in the load, leading to the output signal deviating from the target value. With the test apparatus 2, the fluctuation in the output signal of the power supply apparatus has an effect on the signal output from the DUT 1. That is to say, this leads to a problem in that the abnormal state (Fail) judged by the comparator CP cannot be judged with respect to whether it is due to the DUT 1 itself or due to the power supply apparatus.

In particular, the degree of fluctuation in the load of the DUT 1 in the test operation is greater than that in a state in which the DUT 1 is mounted on a set (electronic device) after shipment. In such circumstances, the power supply apparatus 100 mounted on the test apparatus 2 is strictly required to be highly responsive to the fluctuation in the load. Description will be made below regarding a configuration of the power supply apparatus 100 which can be suitably employed in the test apparatus 2.

The power supply apparatus 100 includes an A/D converter 22, a digital signal processing circuit 24, and a D/A converter 26.

The A/D converter 22 performs analog/digital conversion of an analog observed value S2' that corresponds to the power supply signal S2 supplied to the power supply terminal of the DUT 1 so as to generate a digital observed value S3. The analog observed value S2' may be the power supply voltage Vdd supplied to the DUT 1 as it is, or may be a voltage stepped down by dividing the power supply voltage Vdd.

The digital signal processing circuit 24 generates a digital control value S4 by digital processing. The digital control value S4 is adjusted such that the digital observed value S3 received from the A/D converter 22 matches a predetermined reference value Ref. For example, the digital signal processing circuit 24 may be configured as a CPU (Central Processing Unit), a DSP (Digital Signal Processor), an FPGA (Field Programmable Gate Array), or the like.

The D/A converter 26 performs digital/analog conversion of the digital control value S4, and supplies the resulting signal to the power supply terminal of DUT 1 as the power supply signal S1.

The above is the schematic configuration of the power supply apparatus 100. Next, detailed description will be made regarding the configuration of the digital signal processing circuit 24.

The digital signal processing circuit 24 is configured to be capable of changing the content of the signal processing, i.e., the control characteristics, at a desired timing.

For example, based on the difference between the digital observed value S3 and the predetermined reference value Ref, the digital signal processing circuit 24 may perform a PID (proportional, integral, differential) control operation. With such an arrangement, in the operation for changing the content of the signal processing, various kinds of parameters (e.g., gain, filter order or cutoff frequency) used in the PID control operation may be changed. Also, an operational expression may be modified. Alternatively, the digital signal processing circuit 24 may perform any one of a P control operation, PI control operation, and a PD control operation, instead of the PID control operation.

Also, the digital signal processing circuit 24 may switch the control operation between the PID control operation, P control operation, PI control operation, PD control operation, and so forth, when the content of the signal processing is changed.

Specifically, the digital signal processing circuit 24 changes the content of the signal processing according to the range in which the observed value S2' is included. The digital observed value S3 has a value that corresponds to the observed value S2'. Accordingly, the digital signal processing circuit 24 shown in FIG. 2 changes the content of the signal processing according to the digital observed value S3.

Next, description will be made regarding the change of the content of the signal processing with reference to a specific example.

[First Control Operation]

When starting an operation for generating the power supply signal S2 (power supply voltage Vdd), i.e., when the power supply apparatus 100 is started up, the digital signal processing circuit 24 is configured to be capable of switching the mode between a first mode, a second mode, and a third mode, each of which have different signal processing content.

The mode switching is executed according to the power supply voltage Vdd. Specifically, the mode switching is executed according to the magnitude relation between an observed value that corresponds to the power supply voltage Vdd and two threshold values $V_{th1}$ and $V_{th2}$. Each of the threshold values $V_{th1}$ and $V_{th2}$ is set to be lower than the target value $V_{ref}$. Furthermore, the second threshold value $V_{th2}$ is set to be higher than the first threshold value $V_{th1}$.

Figure 3:
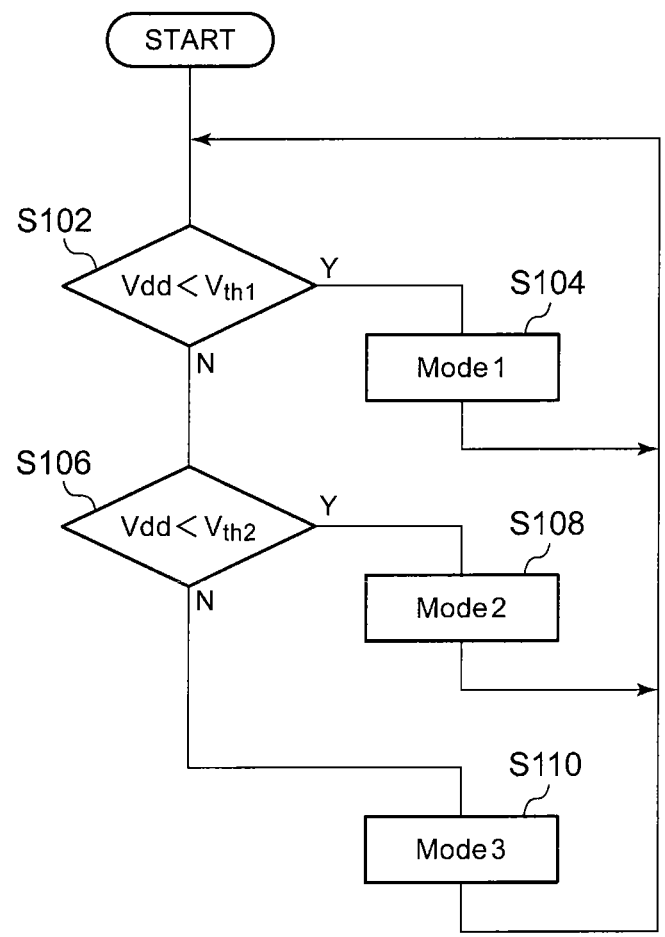
FIG. 3 is a flowchart which shows the state transition of the first control operation of a digital signal processing circuit.

FIG. 3 is a flowchart which shows the state transition in the first control operation of the digital signal processing circuit. When the power supply voltage Vdd is lower than the first threshold voltage $V_{th1}$ (YES in S102), i.e., immediately after the digital signal processing circuit 24 is started up, the digital signal processing circuit 24 operates in the first mode (S104). Furthermore, when the power supply voltage Vdd is higher than the first threshold voltage $V_{th1}$ (NO in S102) and is lower than the second threshold voltage $V_{th2}$ (YES in S106), the digital signal processing circuit 24 operates in the second mode (S108). Furthermore, when the power supply voltage Vdd is higher than the second threshold voltage $V_{th2}$ (NO in S106), the digital signal processing circuit 24 operates in the third mode (S110). The transitions between the respective modes can be controlled by means of a state machine.

Figure 4:
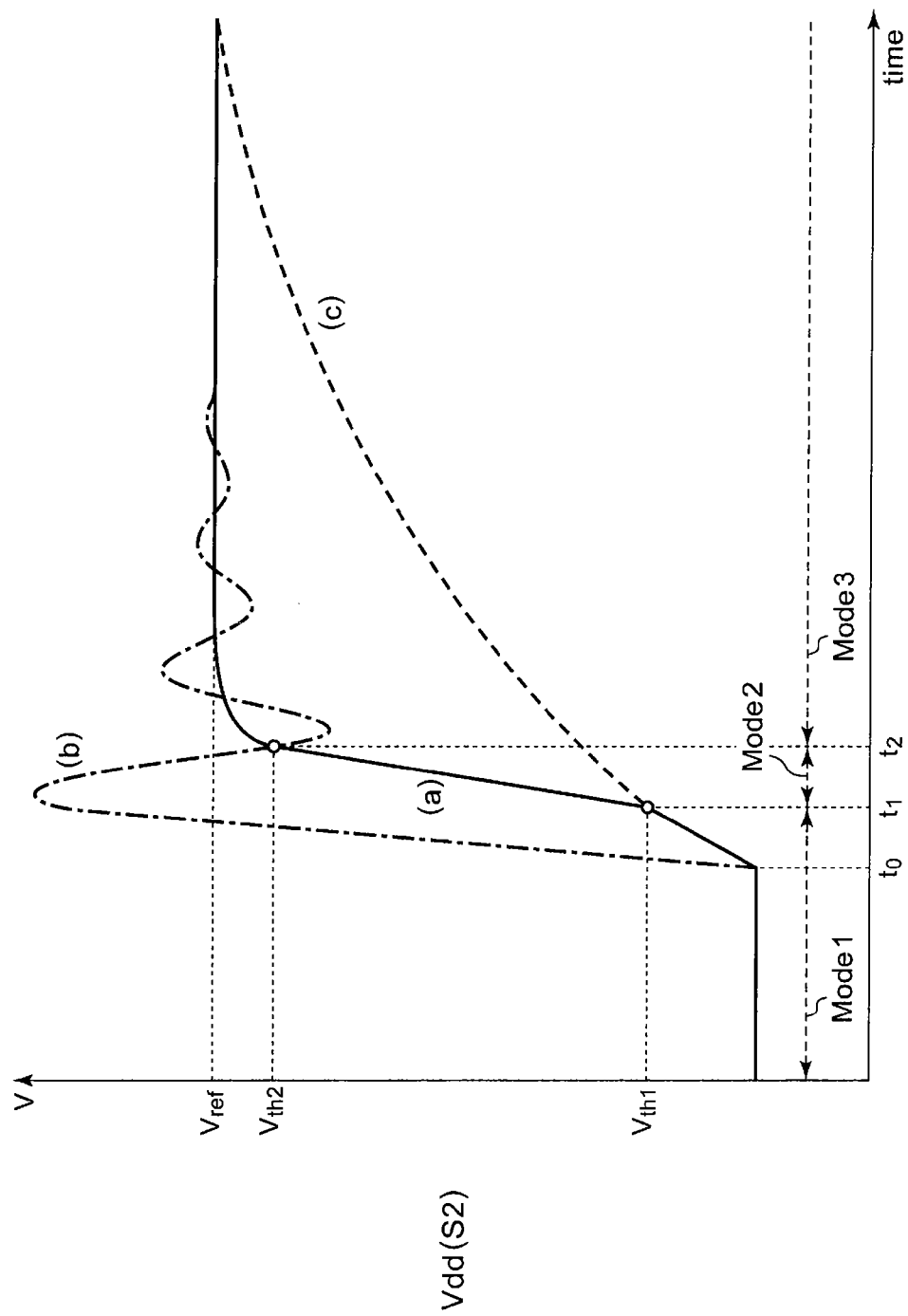
FIG. 4 is a waveform diagram which shows the first operation of the digital signal processing circuit.

FIG. 4 is a waveform diagram which shows the first control operation of the digital signal processing circuit. The solid line (a) represents the waveform obtained with the first control operation, and the line of dashes and dots (b) and the broken line (c) each represent a waveform obtained with a conventional control operation. First, description will be made regarding the conventional operation.

With conventional techniques, regardless of the state of the control target 10, the power supply voltage Vdd is subjected to a feedback control operation with fixed control characteristics. Accordingly, in a case in which the feedback control operation is performed with high speed and high gain control characteristics, the power supply voltage Vdd reaches the target value $V_{ref}$ in a short period of time, as shown by the line of dashes and dots (b). However, this leads to the occurrence of a large overshoot, following which ringing occurs, resulting in a long settling time. On the other hand, in a case in which the feedback control operation is performed with low speed and low gain control characteristics, neither overshoot nor ringing occurs. However, this also leads to an increased settling time.

Next, description will be made regarding the operation of the power supply apparatus 100 shown in FIG. 2, with reference to the solid line (a). In the initial state, the digital signal processing circuit 24 is set to the first mode Mode1. At the time point $t_0$, the power supply apparatus 100 is instructed to start up. Upon receiving the start-up instruction, the digital signal processing circuit 24 generates the control signal S4 in the first mode Mode1 such that the power supply voltage Vdd approaches the target value $V_{ref}$.

When the power supply voltage Vdd reaches the first threshold voltage $V_{th1}$ at the time point $t_1$, the mode of the digital signal processing circuit 24 is switched from the first mode Mode1 to the second mode Mode2. When the power supply voltage Vdd further rises and reaches the second threshold voltage $V_{th2}$, the mode is switched from the second mode Mode2 to the third mode Mode3.

By appropriately setting the content of the signal processing in the modes Mode1 through Mode3, i.e., the control characteristics for the modes Mode1 through Mode3, such an arrangement is capable of stabilizing the power supply voltage Vdd to the target value $V_{ref}$ in a short period of time while suppressing overshoot and ringing in the power supply voltage Vdd.

It should be noted that the mode may be switched between two modes with a single threshold value, instead of the mode switching between the three modes.

[Second Control Operation]

A second control operation is executed during a period in which the power supply signal S2 (power supply voltage Vdd) is to be stably generated. The digital signal processing circuit 24 is configured to be capable of switching the state thereof between a fourth mode Mode4 and a fifth mode Mode5, in each of which the content of the signal processing is different.

The switching of the mode (the content of signal processing) is executed according to the power supply voltage Vdd. Specifically, the mode switching is performed according to the magnitude relation between an observed value that corresponds to the power supply voltage Vdd and two threshold values $V_{th3}$ and $V_{th4}$. The threshold values $V_{th3}$ and $V_{th4}$ are each set to be lower than the target value $V_{ref}$. Furthermore, the fourth threshold value $V_{th4}$ is set to be lower than the third threshold value $V_{th3}$.

Figure 5:
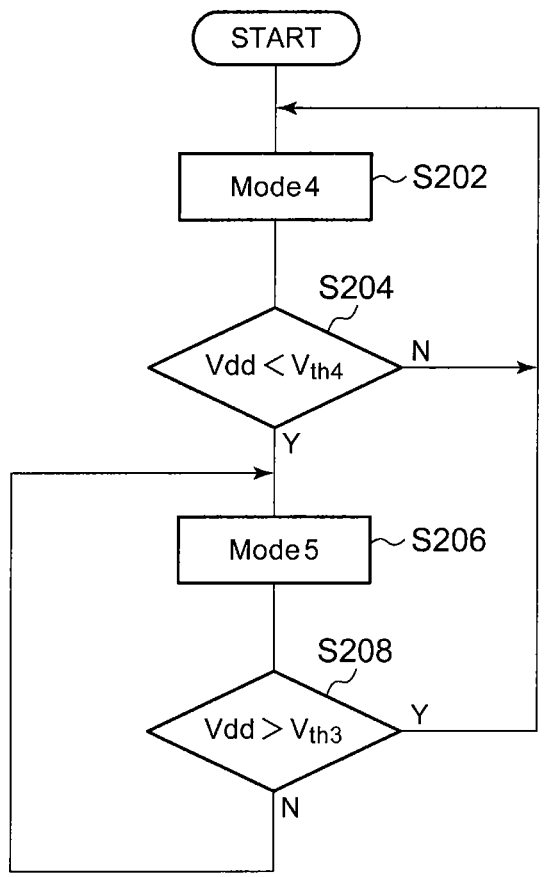
FIG. 5 is a flowchart which shows the state transition in the second operation of the digital signal processing circuit.

FIG. 5 is a flowchart which shows the state transition in the second control operation of the digital signal processing circuit. In a state in which the power supply voltage Vdd is higher than the third threshold voltage $V_{th3}$, i.e., in the fourth mode Mode4 (S202), when the power supply voltage Vdd transits to the state in which it is lower than the fourth threshold value $V_{th4}$ (YES in S202), the mode transits to the fifth mode Mode5 (S206). When such a transition does not occur (NO in S204), the fourth mode Mode4 is maintained.

On the other hand, in a state in which the power supply voltage Vdd is lower than the fourth threshold value $V_{th4}$, i.e., in the fifth mode Mode5 (S206), when the power supply voltage Vdd transits to a state in which it is higher than the third threshold value $V_{th3}$ (YES in S208), the mode is switched to the fourth mode Mode4 (S202). When such a transition does not occur (NO in S208), the fifth mode Mode5 is maintained.

That is to say, the digital signal processing circuit 24 performs a hysteresis operation according to the magnitude relation between the power supply voltage Vdd and the two threshold values $V_{th3}$ and $V_{th4}$.

Figure 6:
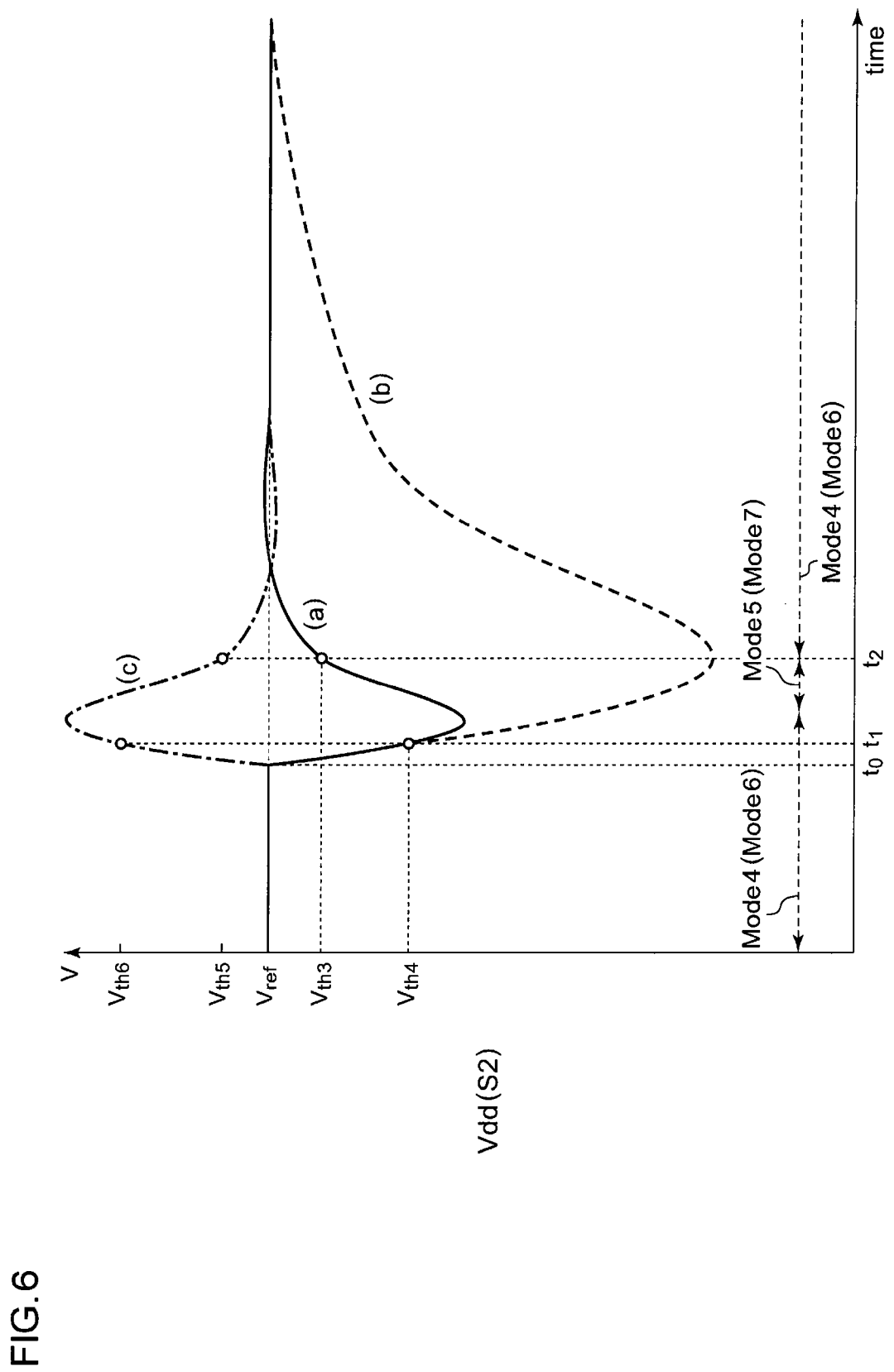
FIG. 6 is a waveform diagram which shows the second control operation of the digital signal processing circuit.

FIG. 6 is a waveform diagram which shows the second control operation performed by the digital signal processing circuit.

The solid line (a) represents a waveform obtained with the first control operation. The broken line (b) represents a waveform obtained with a conventional control operation. First, description will be made regarding the conventional operation.

When a sudden increase occurs in the current consumption of the DUT 1 at the time point $t_0$, the power supply voltage Vdd drops. With conventional techniques, regardless of the state of the power supply voltage Vdd, a feedback control operation is performed with fixed control characteristics. Accordingly, such an arrangement requires a long period of time to return the power supply voltage Vdd to the original target value $V_{ref}$.

Next, description will be made regarding the operation of the power supply apparatus 100 shown in FIG. 2 with reference to the solid line (a). In the initial state, the digital signal processing circuit 24 is set to the fourth mode Mode4. The fourth mode Mode4 may be configured as a mode that corresponds to the aforementioned third mode Mode3. Also, the fourth mode may be configured as a different mode.

When a sudden increase occurs in the current consumption of the DUT 1 at the time point $t_0$, the power supply voltage Vdd starts to drop. When the power supply voltage Vdd drops to the fourth threshold value $V_{th4}$ at the time point $t_1$, the mode is switched to the fifth mode Mode5 in which the high speed control characteristics are used. In this state, the power supply voltage Vdd suddenly rises toward the target value $V_{ref}$.

When the power supply voltage Vdd reaches the third threshold value $V_{th3}$ at the time point $t_2$, the mode is returned to the fourth mode Mode4 in which the low speed control characteristics are used. Subsequently, the power supply voltage Vdd approaches the target value $V_{ref}$ without ringing or overshoot.

As described above, with the second control operation, even if a sudden change occurs in the load, such an arrangement is capable of suppressing fluctuation in the power supply voltage Vdd, thereby reducing the period of time required to return the power supply voltage Vdd to the target value $V_{ref}$.

The above-described method is effectively used to handle a case in which there is a sudden increase in the current consumption of the DUT 1. Conversely, if the current consumption of the DUT 1 suddenly drops, the power supply voltage Vdd would appear to increase. In this case, the following first modification is effectively employed.

With the first modification, the same processing is performed in a range in which the power supply voltage Vdd is higher than the target value $V_{ref}$. The digital signal processing circuit 24 is configured to have a sixth mode Mode6 and a seventh mode Mode7, which are switchable modes, and in each of which the content of the signal processing is different.

The switching of the mode (the content of signal processing) is executed according to the power supply signal S2 (power supply voltage Vdd). Specifically, the mode switching is executed according to the magnitude relation between an observed value that corresponds to the power supply voltage Vdd and two threshold voltages $V_{th5}$ and $V_{th6}$. The fifth threshold voltage $V_{th5}$ and the sixth threshold voltage $V_{th6}$ are set to be higher than the target value $V_{ref}$. Furthermore, the fifth threshold voltage $V_{th5}$ is set to be lower than the sixth threshold voltage $V_{th6}$.

Figure 7:
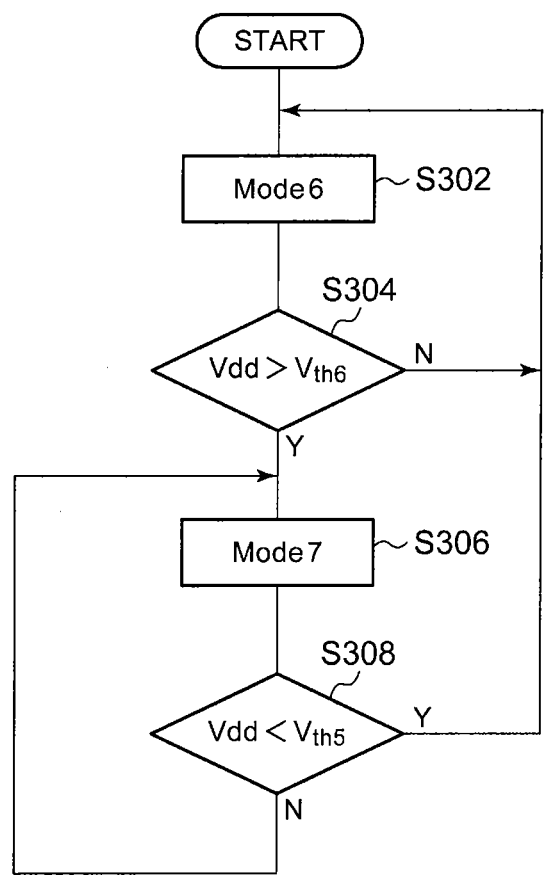
FIG. 7 is a flowchart which shows the state transition in the second control operation of the digital signal processing circuit according to a first modification.

FIG. 7 is a flowchart which shows the state transition in the second control operation of the digital signal processing circuit according to the first modification.

In a state in which the power supply voltage Vdd is lower than the fifth threshold value $V_{th5}$, i.e., in the sixth mode Mode6 (S302), when the power supply voltage Vdd transits to a state in which it is higher than the sixth threshold value $V_{th6}$ (YES in S304), the digital signal processing circuit 24 is switched to the seventh mode Mode7 (S306). When such a transition does not occur (NO in S304), the sixth mode Mode6 is maintained (S302).

Furthermore, in a state in which the power supply voltage Vdd is higher than the sixth threshold value $V_{th6}$, i.e., in the seventh mode Mode7 (S306), when the power supply voltage Vdd transits to a state in which it is lower than the fifth threshold value $V_{th5}$ (YES in S308), the digital signal processing circuit 24 is switched to the sixth mode Mode6 (S302). When such a transition does not occur (NO in S308), the seventh mode Mode7 is maintained.

The waveform which relates to the first embodiment is represented by the line of dashes and dots (c) in FIG. 6. The first modification is capable of suppressing fluctuation in the power supply voltage Vdd even in the case of a sudden decrease in the current consumption of the DUT 1.

In a case in which the content of the signal processing (control characteristics) in the fourth mode is the same as that in the sixth mode, and the control characteristics in the fifth mode are the same as those in the seventh mode, the following second modification is effectively employed. With the second modification, the threshold voltages $V_{th3}$ through $V_{th6}$ are determined as follows.

$$V_{th3}=V_{ref}-\Delta V_1$$

$$V_{th5}=V_{ref}+\Delta V_1$$

$$V_{th4}=V_{ref}-\Delta V_2$$

$$V_{th6}=V_{ref}+\Delta V_2$$

Figure 8:
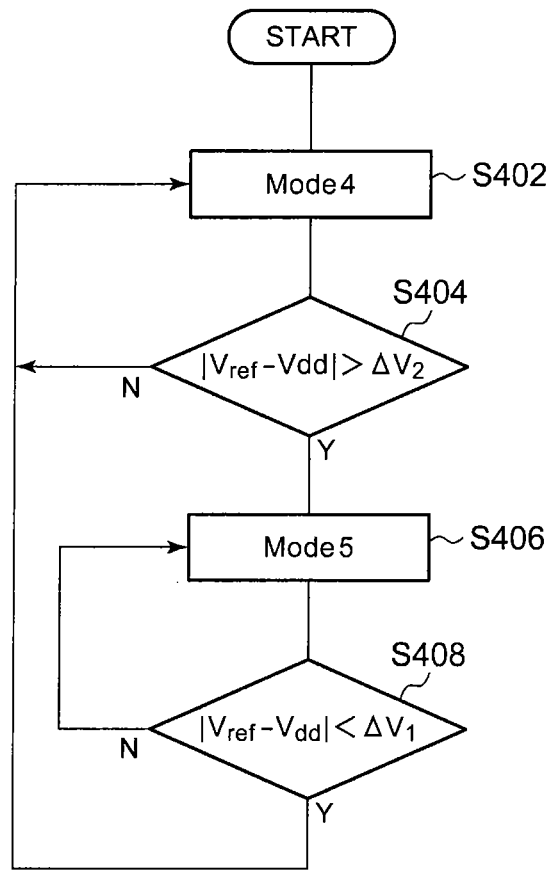
FIG. 8 is a flowchart which shows the state transition in the second control operation of the digital signal processing circuit according to a second modification.

FIG. 8 is a flowchart which shows the state transition in the second control operation of the digital signal processing circuit according to the second modification.

In a state in which the absolute value of the difference between the power supply voltage Vdd and the target value $V_{ref}$ is smaller than the first difference threshold value $\Delta V_1$, i.e., in the fourth mode Mode4 (S402), when the state transits to a state in which the absolute value of the difference is greater than the second difference threshold value $\Delta V_2$ (YES in S404), the digital signal processing circuit 24 is switched to the fifth mode Mode5 (S406). When such a transition does not occur (NO in S404), the fourth mode Mode4 is maintained (S402).

In a state in which the absolute value of the difference is greater than the second difference threshold value $\Delta V_2$, i.e., in the fifth mode Mode5 (S406), when the state transits to a state in which the absolute value of the difference is smaller than the first difference threshold value $\Delta V_1$ (YES in S408), the digital signal processing circuit 24 is switched to the fourth mode Mode4 (S402). When such a transition does not occur (NO in S408), the fifth mode Mode5 is maintained.

The second modification is capable of suppressing fluctuation in the power supply voltage Vdd, both in a case in which a sudden decrease occurs in the current consumption of the DUT 1 and in a case in which a sudden increase occurs in the current consumption thereof.

Description has been made regarding the present invention with reference to the embodiments. The above-described embodiment has been described for exemplary purposes only, and is by no means intended to be interpreted restrictively. Rather, it can be readily conceived that various modifications may be made by making various combinations of the aforementioned components or processes, which are also encompassed in the technical scope of the present invention. Description will be made below regarding such modifications.

Figure 9A:
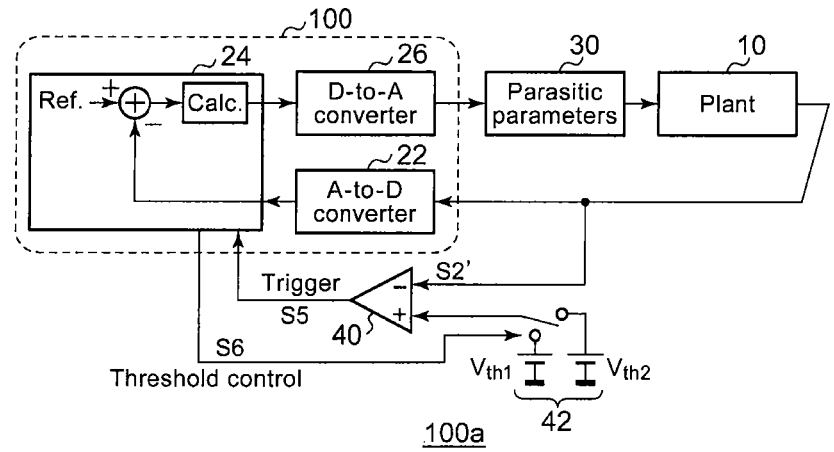
FIGS. 9A through 9C are diagrams each showing a second modification of the power supply apparatus shown in FIG. 2.
Figure 9B:
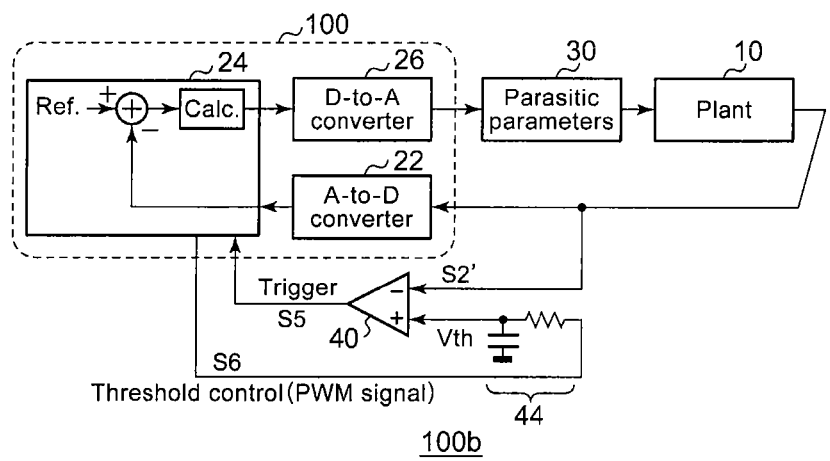
Figure 9C:
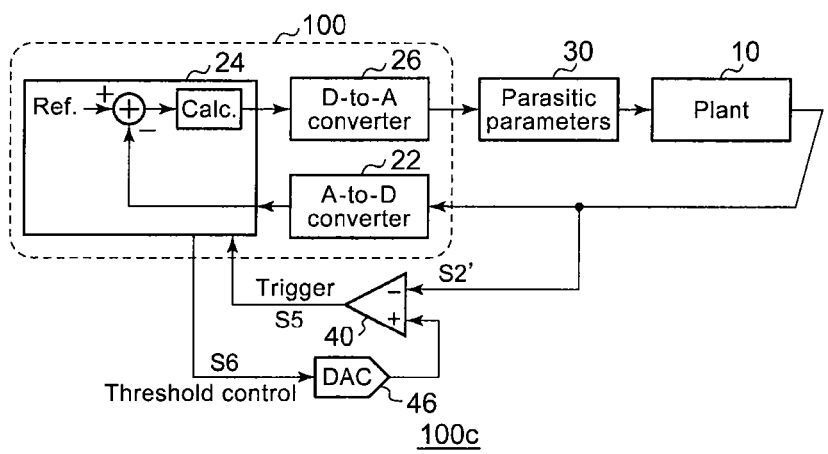

FIGS. 9A through 9C are diagrams each showing a modification of the power supply apparatus 100 shown in FIG. 2.

A power supply apparatus 100a shown in FIG. 9A according to a modification further includes a comparator 40 configured to compare the observed value S2' with a predetermined threshold value $V_{th}$. The digital signal processing circuit 24 modifies the content of the signal processing according to an output signal S5 of the comparator 40 as a trigger.

In some cases, depending on the control method, multiple threshold values $V_{th}$ are employed. In this case, the digital signal processing circuit 24 may generate a threshold control signal S6 which is used to switch the threshold value $V_{th}$, and may output the threshold control signal S6 thus generated to a reference voltage source 42.

With a power supply apparatus 100b shown in FIG. 9B according to a modification, the digital signal processing circuit 24 is configured to be capable of generating a threshold control signal S6 subjected to pulse width modulation such that it has a duty ratio that corresponds to the threshold value $V_{th}$. A low-pass filter 44 performs filtering of the threshold control signal S6, thereby generating the threshold value $V_{th}$. With such a modification, by changing the duty ratio of the threshold control signal S6, the threshold value $V_{th}$ can be controlled.

With a power supply apparatus 100c shown in FIG. 9C according to a modification, the digital signal processing circuit 24 is configured to be capable of generating a threshold control signal S6 having a digital value that corresponds to the threshold value $V_{th}$. A second D/A converter 46 performs digital/analog conversion of the threshold control signal S6 so as to generate an analog threshold value $V_{th}$.

While the preferred embodiments of the present invention have been described using specific terms, such description is for illustrative purposes only, and it is to be understood that changes and variations may be made without departing from the spirit or scope of the appended claims.

What is claimed is:

1. A power supply apparatus for a test apparatus configured to supply a power supply signal to a device under test, the power supply apparatus comprising:
    an A/D converter configured to perform analog/digital conversion of an analog observed value that corresponds to the power supply signal so as to generate a digital observed value;
    a digital signal processing circuit configured to generate, by digital processing, a control value adjusted such that the digital observed value received from the A/D converter matches a predetermined reference value; and
    a D/A converter configured to perform digital/analog conversion of the control value, and to supply the control value thus subjected to digital/analog conversion as the power supply signal,
    wherein the digital signal processing circuit is configured to be capable of switching the content of signal processing,
    and wherein the digital signal processing circuit is configured to switch the content of the signal processing according to a range in which the observed value is included,
    and wherein the digital signal processing circuit is configured to have a first mode, a second mode, and a third mode, which are switchable, and in each of which the content of the signal processing is different, when the generation of the power supply signal is initiated,
    and wherein, when the power supply signal is lower than a first threshold value, the digital signal processing circuit operates in the first mode,
    and wherein, when the power supply signal is higher than the first threshold value and is lower than a second threshold value that is set to be higher than the first threshold value, the digital signal processing circuit operates in the second mode,
    and wherein, when the power supply signal is higher than the second threshold value, the digital signal processing circuit operates in the third mode.

2. A test apparatus comprising a power supply apparatus according to claim 1, configured to supply electric power to a device under test.

3. A power supply apparatus for a test apparatus configured to supply a power supply signal to a device under test, the power supply apparatus comprising:
    an A/D converter configured to perform analog/digital conversion of an analog observed value that corresponds to the power supply signal so as to generate a digital observed value;
    a digital signal processing circuit configured to generate, by digital processing, a control value adjusted such that the digital observed value received from the A/D converter matches a predetermined reference value; and
    a D/A converter configured to perform digital/analog conversion of the control value, and to supply the control value thus subjected to digital/analog conversion as the power supply signal,
    wherein the digital signal processing circuit is configured to be capable of switching the content of signal processing,
    and wherein the digital signal processing circuit is configured to switch the content of the signal processing according to a range in which the observed value is included,
    and wherein the digital signal processing circuit is configured to have a first mode and a second mode, which are switchable, and in each of which the content of the signal processing is different, when the power supply signal is to be stably generated,
    and wherein, when the power supply signal transits from a state in which it is higher than a first threshold value set to be lower than the reference value to a state in which it is lower than a second threshold value set to be lower than the first threshold value, the digital signal processing circuit is switched to the second mode,
    and wherein, when the power supply signal transits from a state in which it is lower than the second threshold value to a state in which it is higher than the first threshold value, the digital signal processing circuit is switched to the first mode.

4. A power supply apparatus for a test apparatus configured to supply a power supply signal to a device under test, the power supply apparatus comprising:
    an A/D converter configured to perform analog/digital conversion of an analog observed value that corresponds to the power supply signal so as to generate a digital observed value;
    a digital signal processing circuit configured to generate, by digital processing, a control value adjusted such that the digital observed value received from the A/D converter matches a predetermined reference value; and
    a D/A converter configured to perform digital/analog conversion of the control value, and to supply the control value thus subjected to digital/analog conversion as the power supply signal,
    wherein the digital signal processing circuit is configured to be capable of switching the content of signal processing,
    and wherein the digital signal processing circuit is configured to switch the content of the signal processing according to a range in which the observed value is included,
    and wherein the digital signal processing circuit is configured to have a first mode and a second mode, which are switchable, and in each of which the content of the signal processing is different, when the power supply signal is to be stably generated,
    and wherein, when the power supply signal transits from a state in which it is lower than a first threshold value set to be higher than the reference value to a state in which it is higher than a second threshold value set to be higher than the first threshold value, the digital signal processing circuit is switched to the second mode,
    and wherein, when the power supply signal transits from a state in which it is higher than the second threshold value to a state in which it is lower than the first threshold value, the digital signal processing circuit is switched to the first mode.

5. A power supply apparatus for a test apparatus configured to supply a power supply signal to a device under test, the power supply apparatus comprising:
- an A/D converter configured to perform analog/digital conversion of an analog observed value that corresponds to the power supply signal so as to generate a digital observed value;
- a digital signal processing circuit configured to generate, by digital processing, a control value adjusted such that the digital observed value received from the A/D converter matches a predetermined reference value; and
- a D/A converter configured to perform digital/analog conversion of the control value, and to supply the control value thus subjected to digital/analog conversion as the power supply signal,
- wherein the digital signal processing circuit is configured to be capable of switching the content of signal processing,
- and wherein the digital signal processing circuit is configured to switch the content of the signal processing according to a range in which the observed value is included,
- and wherein the digital signal processing circuit is configured to have a first mode and a second mode, which are switchable, and in each of which the content of the signal processing is different, when the power supply signal is to be stably generated,
- and wherein, when a transition occurs from a state in which the absolute value of the difference between the power supply signal and the reference value is smaller than a first difference threshold value to a state in which it is greater than a second difference threshold value set to be greater than the first difference threshold value, the digital signal processing circuit is switched to the second mode,
- and wherein, when a transition occurs from a state in which the absolute value of the difference is greater than the second difference threshold value to a state in which it is smaller than the first difference threshold value, the digital signal processing circuit is switched to the first mode.

6. A power supply apparatus for a test apparatus configured to supply a power supply signal to a device under test, the power supply apparatus comprising:
- an A/D converter configured to perform analog/digital conversion of an analog observed value that corresponds to the power supply signal so as to generate a digital observed value;
- a digital signal processing circuit configured to generate, by digital processing, a control value adjusted such that the digital observed value received from the A/D converter matches a predetermined reference value; and
- a D/A converter configured to perform digital/analog conversion of the control value, and to supply the control value thus subjected to digital/analog conversion as the power supply signal,
- wherein the digital signal processing circuit is configured to be capable of switching the content of signal processing,
- and wherein the change of the content of the signal processing is a change of parameters used in digital signal processing.

7. A power supply apparatus for a test apparatus configured to supply a power supply signal to a device under test, the power supply apparatus comprising:
- an A/D converter configured to perform analog/digital conversion of an analog observed value that corresponds to the power supply signal so as to generate a digital observed value;
- a digital signal processing circuit configured to generate, by digital processing, a control value adjusted such that the digital observed value received from the A/D converter matches a predetermined reference value; and
- a D/A converter configured to perform digital/analog conversion of the control value, and to supply the control value thus subjected to digital/analog conversion as the power supply signal,
- wherein the digital signal processing circuit is configured to be capable of switching the content of signal processing,
- and wherein the change of the content of the signal processing is a change of operation expressions used in digital signal processing.

8. A power supply apparatus for a test apparatus configured to supply a power supply signal to a device under test, the power supply apparatus comprising:
- an A/D converter configured to perform analog/digital conversion of an analog observed value that corresponds to the power supply signal so as to generate a digital observed value;
- a digital signal processing circuit configured to generate, by digital processing, a control value adjusted such that the digital observed value received from the A/D converter matches a predetermined reference value; and
- a D/A converter configured to perform digital/analog conversion of the control value, and to supply the control value thus subjected to digital/analog conversion as the power supply signal,
- wherein the digital signal processing circuit is configured to be capable of switching the content of signal processing,
- and wherein the digital signal processing circuit is configured to change the content of the signal processing according to the value of the digital observed value.

9. A power supply apparatus for a test apparatus configured to supply a power supply signal to a device under test, the power supply apparatus comprising:
- an A/D converter configured to perform analog/digital conversion of an analog observed value that corresponds to the power supply signal so as to generate a digital observed value;
- a digital signal processing circuit configured to generate, by digital processing, a control value adjusted such that the digital observed value received from the A/D converter matches a predetermined reference value; and
- a D/A converter configured to perform digital/analog conversion of the control value, and to supply the control value thus subjected to digital/analog conversion as the power supply signal,
- wherein the digital signal processing circuit is configured to be capable of switching the content of signal processing,
- and the power supply apparatus further comprises a comparator configured to compare the observed value with a predetermined threshold value,
- wherein the digital signal processing circuit is configured to change the content of the signal processing according to an output signal of the comparator.

10. A power supply apparatus according to claim 9, wherein the digital signal processing circuit is configured to be capable of generating a threshold control signal subjected to pulse width modulation such that it has a duty ratio that corresponds to the threshold value, and wherein the power supply apparatus further comprises a low-pass filter configured to perform filtering of the threshold control signal so as to generate the threshold value.

11. A power supply apparatus according to claim 9, wherein the digital signal processing circuit is configured to be capable of generating a threshold control signal having a digital value that corresponds to the threshold value, and wherein the power supply apparatus further comprises a second D/A converter configured to perform digital/analog conversion of the threshold control signal so as to generate the threshold value.

12. A power supply apparatus according to claim 9, wherein the threshold value is switchable between multiple values according to the content of the signal processing.

* * * * *